United States Patent [19]

Hewitt et al.

[11] Patent Number: 4,956,716
[45] Date of Patent: Sep. 11, 1990

[54] IMAGING SYSTEM EMPLOYING CHARGE AMPLIFIER

[75] Inventors: Mary J. Hewitt; Johannes B. de Bruin, both of Santa Barbara, Calif.

[73] Assignee: Santa Barbara Research Center, Goleta, Calif.

[21] Appl. No.: 312,262

[22] Filed: Feb. 21, 1989

[51] Int. Cl.$^5$ .............................................. H04N 3/14
[52] U.S. Cl. ............................. 358/213.27; 358/212; 358/213.11
[58] Field of Search .............. 358/212, 213.11, 213.12, 358/213.26, 213.27; 357/24 LR, 30 G, 30 H; 250/578

[56] References Cited

U.S. PATENT DOCUMENTS

| | | | |
|---|---|---|---|
| 4,363,963 | 12/1982 | Ando | 358/212 |
| 4,382,187 | 5/1983 | Fraleux et al. | 358/213.11 |
| 4,593,320 | 6/1986 | Nishizawa et al. | 358/213.12 |
| 4,645,938 | 2/1987 | Brissot et al. | 358/213 |
| 4,819,071 | 4/1989 | Nakamura | 358/213.12 |

Primary Examiner—Stephen Brinich
Attorney, Agent, or Firm—W. C. Schubert; W. K. Denson-Low

[57] ABSTRACT

A system 10 for imaging radiation received from a scene provides for the focusing of the radiation upon a set of detectors 12. A set of amplifiers 14 couple the detectors to an image processor 24 for forming an image of the scene. The amplifiers are pulsed with a repeating sequence of pulses providing sequential operation of the amplifiers. The amplifiers and the detectors are constructed on a single substrate which is cyrogenically cooled for improved signal-to-noise ratio. Amplifying elements in each of the amplifiers are powered by energy stored as electric charges in capacitors. The capacitors are recharged with pulses from a pulsing unit repetitively in a repeating sequence of amplifier operation. The capacitors provide for integration of detector signals, there being additional integration performed at the front end of each of the amplifiers utilizing stray capacitance and detector capacitance. Adjustment of front end voltage of each of the amplifiers permits compensation for nonuniformities among the detectors. There results an improved signal-to-noise ratio which can be optimized for different sampling rates of incoming radiation signals.

14 Claims, 4 Drawing Sheets

IMAGING SYSTEM EMPLOYING CHARGE AMPLIFIER

BACKGROUND OF THE INVENTION

This invention relates to the construction of radiation imaging systems, as well as other systems providing for the amplification of low level signals, such as systems employing cryogenic apparatus and, more particularly, to the construction of a set of amplifiers and systems employing the amplifiers wherein each amplifier is formed of stages powered by electric energy stored in capacitors.

A situation of particular interest in the amplification of small signals is found in the amplification of a set of signals obtained from an array of radiation detectors, such as an array of infrared (IR) semiconductor detectors employed in an imaging system. Such an imaging system may be used in radio astronomy. The faint signals of distant sources of radiation are focused by an optical unit upon the detectors located at a focal plane of the optical unit for detection of the signals, and are amplified by semiconductor amplifiers coupled to respective ones of the detectors. It is common practice to mount the detectors in a cold compartment located behind the optical unit to reduce the presence of noise. The detectors are cooled cryogenically. It is also advantageous to operate the amplifiers at cryogenic temperatures to reduce the generation of noise by the amplifiers. A problem arises in that currently available amplifiers for amplification of the detector signals dissipate more power than is desireable, thereby creating a burden of heat removal for cryogenic equipment. In addition, such amplifiers do not readily permit correction of nonuniformity in the responsivities of the individual detectors at the focal plane so as to simplify subsequent signal processing, and may lack a desired degree of radiation hardness.

SUMMARY OF THE INVENTION

The foregoing problem is overcome and other advantages are provided by an imaging system comprising a set of radiation detectors and a corresponding set of amplifiers which may be constructed on a common semiconductor substrate. The amplifiers couple the detectors to a multiplexer for sequential outputting of signals of the detectors to an image processor which constructs an image of a scene viewed by the detectors. The detectors may be arranged in a two-dimensional array for viewing the scene, or in a line array which is scanned across the scene to obtain imaging data thereof.

In accordance with a feature of the invention, the imaging system is hardened against radiation, is operative with reduced power to facilitate cryogenic installation of the system, and is adapted for reception of faint signals upon a low signal-strength background as found in astronomy by construction of each of the amplifiers of stages of field-effect transistors (FET's) powered by electric energy stored in capacitors. In each amplifier, a sequence of gating signals is applied to the FET's for initializing the amount of charge stored in each of the capacitors, after which a detector signal is sampled, amplified and passed to the multiplexer. In the detection process of each detector, the signal-to-noise ratio is enhanced by integration of the detector signal prior to a sampling of the detector signal.

The operations of the respective amplifiers are staggered by timing circuitry to enable the sequential sampling of detector signals for the multiplexing operation, and for any digitizing and encoding of the detector signals which may be desired for the image processing. By constructing the detectors and the amplifiers on a common semiconductor substrate, individual detector responsivity correction can be accomplished directly at the radiation focal plane of an optical focussing device which may be employed with the set of detectors.

It is noted that the construction of the amplifiers permits their use for the amplification of low level signals other than those of radiation detectors, the amplifiers being particularly advantageous in cryogenic applications because of the low power consumption of each amplifier. Also, the initialization of charge stored in the capacitors for powering each of the amplifier stages inhibits the development of any drift in amplifier characteristics, this being a feature which is desireable in many amplifier applications. This provides improved uniformity in the resultant scene image of an imaging system.

BRIEF DESCRIPTION OF THE DRAWING

The foregoing aspects and other features of the invention are explained in the following description, taken in connection with the accompanying drawing wherein.

DETAILED DESCRIPTION

Figure 1:
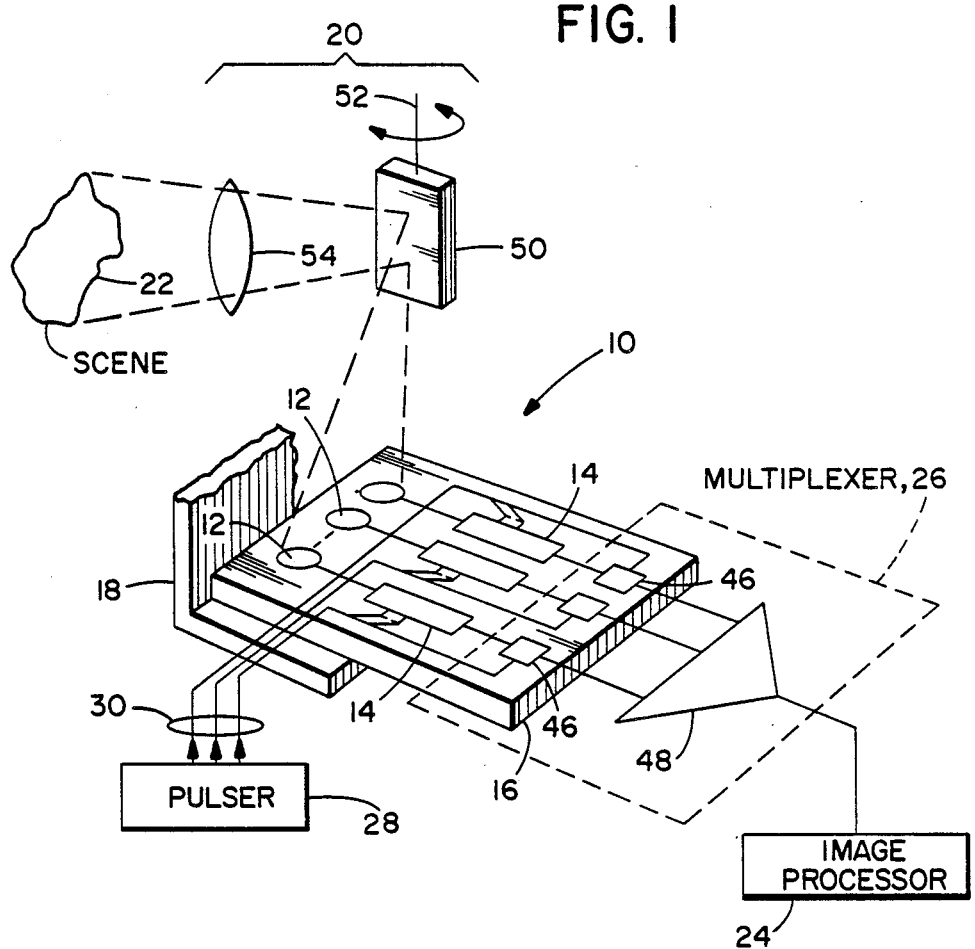
FIG. 1 is a diagrammatic view of an infrared imaging system employing the invention.

FIG. 1 shows an infrared imaging system 10 comprising an array of infrared semiconductor detectors 12 and a corresponding set of semiconductor amplifiers 14 constructed on a common substrate 16 in accordance with the invention. While the ensuing description is directed to a preferred embodiment of the invention which is particularly suited for the detection and imaging of infrared radiation, it is to be understood that the theory of the invention applies equally well to other forms of radiation. The detectors 12 and the amplifiers 14 are cooled by a cryogenic cooling unit 18. An optical unit 20 focuses infrared radiation of a scene 22 upon the detectors 12, the detectors 12 being located at a focal plane of the optical unit 20. In response to radiation incident upon the detectors 12, the detectors 12 output signals which are amplified by respective ones of the amplifiers 14. The system 10 also includes an image processor 24 which combines the detector signals, as amplified by the amplifiers 14, to produce an image of the scene 22. Output signals of the amplifiers 14 are coupled sequentially by a multiplexer 26 to the image processor 24.

As will be explained hereinafter, each of the amplifiers 14 and the multiplexer 26 are operated by means of a set of voltage pulses having prescribed waveforms, the pulses occurring at specific instances of time. The set of pulses is repeated successively for sequential operation of the amplifiers 14. The system 10 includes a pulsing unit 28 which generates the foregoing sets of pulses. Output lines 30 of the pulsing unit 28 connect with various terminals of the amplifiers 14 and the multiplexer 26, as will be described with reference to FIG. 4, for applying the pulses to the amplifiers 14 and to the multiplexer 26.

Figure 2:
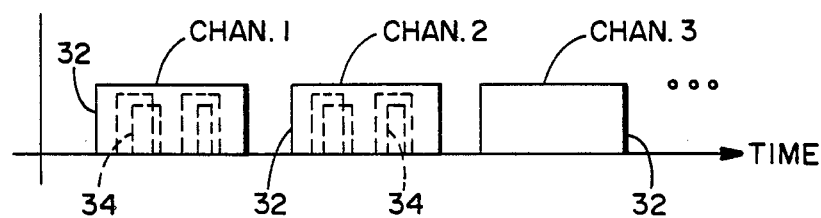
FIG. 2 is a timing diagram demonstrating a sequencing of operations of individual amplifier channels of the system of FIG. 1.

FIG. 2 describes the succession of sets of pulses outputted by the pulsing unit 28. A separate set 32 of pulses is generated for each of the amplifiers 14. The sets 32 occur repetitively in a repeating sequence. In each set 32, there are shown, in stylized form, individual pulses 34. Only a few of the pulses 34 are shown in FIG. 2 by way of example; all of the pulses will be described with reference to FIG. 5.

Figure 3:
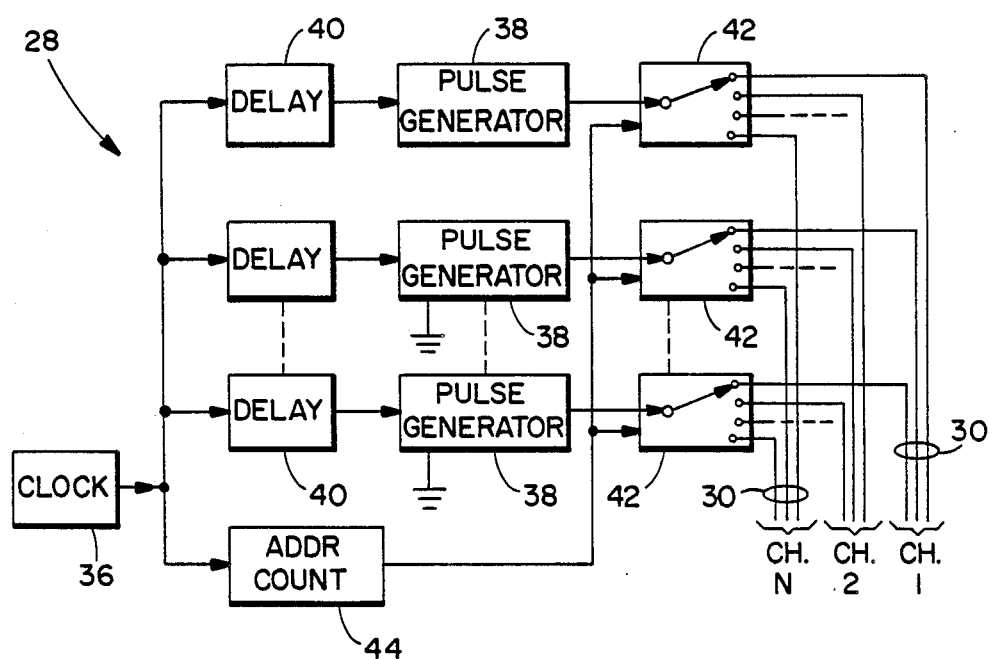
FIG. 3 shows a signal generator providing a sequence of voltage waveforms for operation of the individual amplifier channels of the system of FIG. 1.

FIG. 3 shows an embodiment of the pulsing unit 28 which is readily constructed, it being understood that other well-known forms of pulse generation and timing circuitry may be employed. The pulsing unit 28 comprises a clock 36, a set of pulse generators 38, and a corresponding set of delay units 40 and stepping switches 42. An address counter 44 coupled to an output terminal of the clock 36 addresses the switches 42. While a switch 42 is shown diagrammatically as a mechanical stepping switch for illustrative purposes, it is to be understood that each switch 42 is constructed of well-known semiconductor circuitry addressable by digitally formatted signals as are outputted by the counter 44.

There is one pulse generator 38 for each of the voltage pulses to be applied to one of the amplifiers 14, each of the generators 38 generating a specific one of the pulses. Associated with each of the generators 38 is one of the delay units 40 and one of the switches 42. Each delay unit 40 is coupled between the output terminal of the clock 36 and an input terminal of a pulse generator 38 for imparting a predetermined delay to the operation of the generator 38. Thereby, the set of delay units 40, in cooperation with the clock 36 generate a set of timing signals for strobing the generators 38 to provide their respective output pulses in the desired sequence All of the switches 42 receive the same address from the counter 44, and thereby are synchronized. Initially, the switches 42 steer the output pulses of the generators 38 to one of the amplifier channels (FIG. 1) for applying the pulses to the amplifier 44 thereof and to a corresponding stage 46 of the multiplexer 26. With subsequent addresses of the counter 44 and, in accord with the pulsing sequence shown in the timing diagram of FIG. 2, the switches 42 steer the pulses of the generators 38 sequentially to other ones of the amplifier channels. Output signals of the multiplexer stages 46 are combined in a summing amplifier 48 of the multiplexer 26 for transmittal to the image processor 24.

The foregoing description of the system 10 of FIG. 1 is applicable to both a line array of the detectors 12 and to a two dimensional array of the detectors 12. In the event that a line array is employed, a scanning mirror 50 is included within the optical unit 20 for scanning the radiation past the line array, thereby to provide data for a two-dimensional image of the scene 22. The scanning mirror 50 pivots periodically about an axis 52 to develop a succession of scan lines across the scene 22. The mirror 50 is placed behind a focusing element 54 of the optical unit 20. The focusing element 54 may be a lens, as shown, or a concave mirror, or may comprise a set of optical elements (not shown) as is well known in the art.

Figure 4:
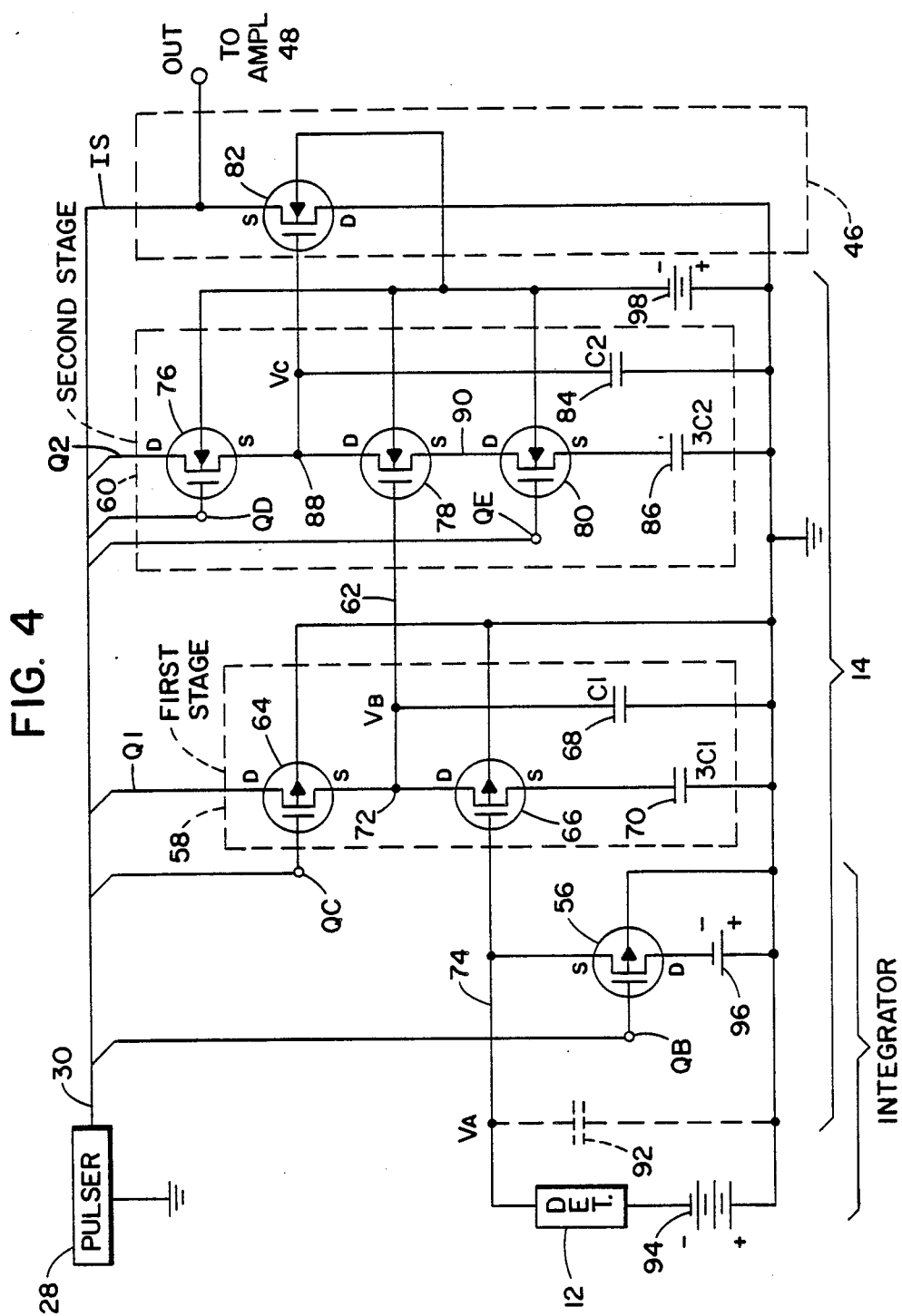
FIG. 4 is a schematic diagram of an electric circuit of one of the amplifier channels of the system of FIG. 1, each of the amplifier channels embodying the invention.

With reference to FIG. 4, there is shown a schematic diagram of the amplifier 14 and its corresponding multiplexer stage 46 in one of the amplifier channels of FIG. 1. The amplifier 14 comprises a transistor 56 which operates with a detector 12 to develop a signal suitable for amplification by the amplifier 14. The amplifier 14 further comprises a first amplifying stage 58 and a second amplifying stage 60. An input terminal of the second amplifying stage 60 is coupled via line 62 to an output terminal of the first amplifying stage 58.

In accordance with the invention, the first stage 58 comprises two transistors 64 and 66 which are powered by electric energy stored in two capacitors 68 and 70. The three transistors 56, 64, and 66 are each N-channel MOSFET's (metal oxide semiconductor field effect transistor). In the first stage 58, the transistors 64 and 66 are connected in series with the source terminal of the transistor 64 being coupled to the drain terminal of the transistor 66 at a junction point, or node, 72. The capacitor 70 is connected between the source terminal of the transistor 66 and ground. The capacitor 68 is connected between the drain terminal of the transistor 66 and ground. The gate terminal of the transistor 66 connects via line 74 to the source terminal of the transistor 56 and to a terminal of the detector 12.

In accordance with the practice of the invention, it is noted that operating power for the transistor 66 is provided completely by energy previously stored in the capacitors 68 and 70. With respect to the transistor 64, both the drain and the gate terminals thereof are connected via individual conductors of the line 30 to pulse generators 38 of the pulsing unit 28 (FIG. 3). Each of the pulse generators 38, during the generation of a pulse on line 30 act as a voltage source providing a voltage pulse between a conductor of line 30 and ground. Current flows through the transistor 64 only during an interval of pulsing by the pulsing unit 28.

The construction of the second stage 60 is similar to that of the first stage 58, except that an additional transistor is provided for a total of three transistors, namely, transistors 76, 78, and 80. A further transistor 82 is located within the multiplexer stage 46. All four of the transistors 76, 78, 80, and 82 are P-channel MOSFET's.

As will be described subsequently, the operation of the transistors 76 of the second stage is similar to the operation of the transistor 64 of the first stage. The transistor 66 of the first stage is replaced with the two transistors 78 and 80 of the second stage. In accordance with a feature of the invention, both of the transistors 78 and 80 of the second stage are supplied with operating power with electric charge stored in two capacitors 84 and 86. The interconnection of the capacitors 84 and 86 of the second stage, as well as their operation, follow that of the capacitors 68 and 70 of the first stage. The capacitor 86 connects between the source terminal of the transistor 80 and ground. The capacitor 84 connects between the drain terminal of the transistor 78 and ground. The three transistors 76, 78, and 80 of the second stage are connected in series; the source and the drain terminals of the transistors 76 and 78, respectively, are connected at a junction point or node 88, while the source and the drain terminals of the transistors 78 and 80, respectively, are connected together via line 90.

It is noted that no external source of power is connected to the series combination of the transistors 78 and 80 in that both ends of the series combination, namely the source terminal of the transistor 80 and the drain terminal of the transistor 78, are connected to the capacitors 86 and 84. The gate terminal of the transistor 80 is connected to a conductor of line 30 to receive a pulse signal from the pulsing unit 28 via a conductor of the line 30. As is well known, essentially no power is drawn by the transistors 78 and 80 via their gate terminals. Thus, all of the power employed in the operation of the transistors 78 and 80 is provided by electric energy stored as charge in the capacitors 84 and 86.

The transistor 76 has both its drain and its gate terminals connected to the pulsing unit 28 via conductors of the line 30. No current flows in the transistor 76 except during a pulsing interval provided by the pulsing unit 28. Thus, any power transferred through the transistor 76, or dissipated therein, as well as any power transferred through the transistor 64, or dissipated therein, only occurs during pulsing intervals of the pulsing unit 28.

With respect to the transistor 82 of the multiplexer stage 46, the drain terminal thereof is grounded, the gate terminal thereof is connected to an output terminal of the second stage 60 at the node 88, and the source terminal of the transistor 82 connects via a conductor of the line 30 to the pulsing unit 28. The gate terminal of the transistor 82 serves as one of a plurality of input ports to the multiplexer 46 (FIG. 1). An output signal of the transistor 82 is taken at a source terminal and applied as an input signal to the amplifier 48 (FIG. 1). Here, too, there are no external power supply connections to the transistor 82, the only flow of power to the transistor 82, or dissipated therein, occurring during a pulsing of the transistor 82 by the pulsing unit 28.

In the second stage 60, the transistor 80 provides a gating function for delineating the length of a sampling interval of a signal coupled via line 62 from the first stage 58 to the second stage 60. Both of the transistors 78 and 80 serve the function of providing signal gain in the second stage 60. Similarly, the transistor 66 in the first stage 58 provides the function of providing gain to a signal coupled thereto by a line 74.

A feature of the invention is found in the integration of a signal outputted by the detector 12 in response to radiation incident thereupon. By way of example, in considering the case of the detection of infrared radiation, it is well known that infrared detectors have capacitance between the two terminals of the detector. Also, additional capacitance in the nature of stray capacitance, as indicated by a capacitor 92 drawn in phantom, exists between conductors connecting the detector 12 with the amplifier 14. The capacitor 92 connects between the line 74 and ground. In the case of infrared radiation, the detector 12 is a photoconductive detector wherein the resistance to electric current varies in accordance with the intensity of radiation incident upon the detector 12. The detector 12 is operated in series with a battery 94 providing a voltage, typically, of 25 volts. Assuming that the capacitor 92 represents the sum of all capacitances, namely those of the detector 12, the stray capacitance and the capacitance associated with the transistor circuitry of the transistors 56 and the first stage 58, it is appreciated that the capacitor 92 in combination with the internal resistance of the detector 12 can be treated as an integrator.

The integration function is important for providing an improved signal-to-noise ratio in the detection of infrared radiation signals incident upon the detector 12. The transistor 56 serves to initialize the integrator by discharging the capacitor 92 of charge accumulated during a previous interval of time during which the detector 12 is illuminated with the infrared radiation. By virtue of a drive signal applied by the pulsing unit 28 to the gate terminal of the transistor 56, the transistor 56 is operated periodically to discharge the capacitor 92. A bias voltage of approximately one volt is applied between the drain terminal of the transistor 56 and ground by a battery 96, the battery voltage in combination with the drive signal of the pulsing unit 28 providing the requisite operating conditions for the discharging of the capacitor 92. The bias voltage provided by both of the batteries 94 and 96 have negative polarity.

In the case of the N-channel transistors 56, 64, and 66, the fourth terminal (indicated by an arrowhead) connected to the substrate of the transistor is grounded to provide for proper operating conditions for these transistors. In the case of the four P-channel transistors 76, 78, 80 and 82, the fourth terminal (indicated by an arrow) connected to a substrate in each of these transistors is connected to a negative terminal of the battery 98 to provide a bias voltage. The positive terminal of the battery is grounded. A typical value of voltage for the battery 98 is five volts.

With respect to the capacitor 68 and 70, the capacitance of the capacitor 68 is indicated in the drawing as having a value C1. The capacitance of the capacitor 70 is three times as great as that of the capacitor 68. The capacitance of the capacitor 70 is indicated in the drawing as having a value of 3C1. A similar capacitance ratio is employed in the second stage capacitors 84 and 86, the two values of capacitance being indicated in the drawing as C2 and 3C2, respectively. The ratio of the capacitances of the capacitor 68 and 70 in the first stage, and of the capacitors 84, and 86 in the second stage determines the voltage gains of the first stage 58 and the second stage 60. A capacitance ratio of three provides a voltage gain of three while, in general, the voltage gain is equal to the ratio of these capacitances. The combined voltage gain of the two stages 58 and 60 is equal to the product of the voltage gain of the first stage and the voltage gain of the second stage.

Figure 5:
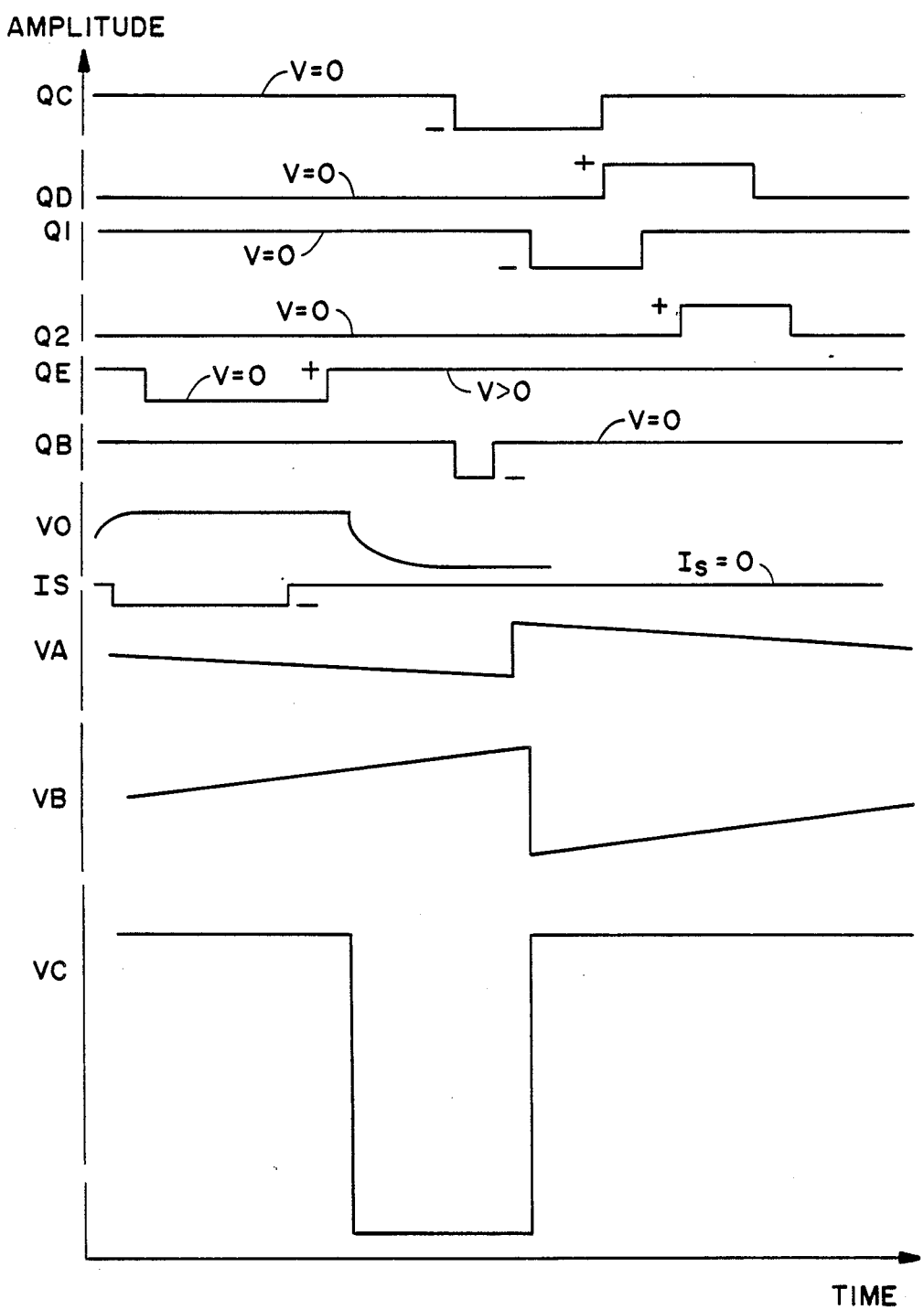
FIG. 5 is a timing diagram showing a set of signal waveforms appearing at various locations in the circuit of FIG. 4.

With reference also to FIG. 5, the operation of the amplifier 14 of FIG. 4 is explained further now with the aid of the voltage waveforms shown in the timing diagram of FIG. 5. FIG. 5 shows the waveforms in time registration of each other. At the top of FIG. 5, there are graphs of six voltage waveforms QC, QD, Q1, Q2, QE, and QB, and a current Is supplied by the pulsing unit 28 via line 30. Also shown is a graph of the output voltage VO. Three additional voltage waveforms VA, VB, and VC are shown as the bottom three graphs of the timing diagram in FIG. 5. The foregoing identifying labels of the waveforms appear in FIG. 4 at the locations in the circuit where these waveforms are found.

With respect to the N-channel transistors 56, 64, and 68, negative pulses are applied to induce conduction of the transistors, as are indicated in the graphs QC, Q1, and QB. With respect to the P-channel transistors 76, 78, and 80, positive voltage pulses are applied as are indicated in the graphs QD, Q2, and QE for inducing a flow of current. In the case of the voltage waveform QE, the voltage is always of a positive voltage except for a pulse of zero volts for terminating conduction in the transistor 80.

A feature of the invention is the capacity for adjusting the circuitry of FIG. 4 to match the characteristics of an individual one of the detectors 12. Thereby, the varying responsivities of a set of the detectors 12 can be equalized. This is accomplished by adjusting the voltage provided by the battery 96. In this connection, it is noted that the battery 96 may be implemented by any convenient form of variable voltage source.

In operation, the application of the pulse QB to the gate terminal of the transistor 56 induces a flow of current through the transistor 56 which discharges the capacitor 92. Prior to the flow of current through the transistor 56, the voltage VA has a relatively low value due to the negative voltage of the battery 94. Upon initiating the state of conduction of the transistor 56, current flows through the detector 12 raising the voltage VA to a higher value as indicated in FIG. 5, the higher value following the pulse QB. Thereafter, upon cessation of the current flow in the transistor 56, the voltage VA on line 74 gradually drifts downward as charge in the capacitor 92 slowly flows as current through the detector 12. The magnitude of the detector current flowing through the capacitor 92 is dependent on the intensity of the infrared radiation. The voltage VA is amplified by the first stage 60 to provide a larger inverted voltage VB, depicted in FIG. 5. The amount of capacitance at the capacitor 92 which is to be employed in the integration process for a sample of radiation signal is dependent on the specific application of the circuit. The addition of additional capacitance in parallel with the capacitor 92 may be regarded as a tuning operation for optimizing the circuit of FIG. 4 to a specific data rate at which incoming radiation signals are to be sampled.

The transistor 66 is operated in a source-follower mode wherein the source voltage tends to follow the gate voltage. During a state of conduction of the transistor 66, current flows between the two capacitors 68 and 70 via the transistor 66. As noted above, because the capacitance of the capacitor 70 is three times as great as the capacitance of the capacitor 68, a voltage gain of three is attained wherein the voltage VB is three times as great as the voltage VA. The transistor 64 is operated as a switch which applies current from the pulsing unit 28 to reset the initial values of charge on the capacitors 68 and 70.

As a result of the foregoing operation, there is no current flow in the transistors of the first stage 58, nor any withdrawal of power from a power supply (not shown but included within the pulsing unit 28) until an output signal appears at the detector 12. This reduces power dissipation to a very low average level within the circuit of each of the amplifiers 14 so as to facilitate operation at cyrogenic temperatures.

A further feature of the invention may be appreciated from the fact that the transistors are operated, either in a state of conduction, or non-conduction between fixed values of voltages supplied by the pulsing unit 28. As a result of this form of operation, the circuit is resistant to high energy radiation, such as cosmic radiation and other sources of nuclear radiation. The circuitry is not sensitive to drifts in threshold values of transistor characteristics induced by the high energy radiation due to the foregoing mode of operation. Thus, the circuitry can be characterized as being radiation hardened.

The voltage QC applied to the gate terminal of the transistor 64 induces conduction in the transistor during the duration of the negative value of the voltage pulse. Conduction terminates when the voltage returns to a zero or slightly positive value of voltage. Comparing the waveform of Q1 with the waveform of QC, it is seen that Q1 is a negative pulse beginning at approximately the middle of the QC pulse. The QC and Q1 waveforms are employed in a reset operation to clear out any signal remaining from a previous voltage developed by the detector 12. During the first half of the QC pulse interval, the capacitor 70 is charged, and during the second half of the QC pulse, charge flows from the capacitor 70 to the capacitor 68 until the voltages across the two capacitors 68 and 70 are equal. The voltage pulses of the waveforms Q1 and QC, as well as other ones of the voltage waveforms of the pulsing unit 28, have a magnitude of approximately five volts. The QB pulse which resets the integration operation also is a part of the reset operation.

The transistor 64 is essentially open circuited subsequent to the reset procedure. During the flow of current between the two capacitors 68 and 70 via the transistor 66 in response to the voltage VA, the current continues to flow until a sufficient voltage difference exists between the source and the drain terminals of the transistor 66 to stop flow of the transistor current. This is in the nature of an integration operation in which the capacitors 68 and 70 serve as integrating elements.

A similar operation appears in the second stage 60. The relationship between the voltage waveforms QD and Q2 is the same as that between the waveforms QC and Q1 described above. The voltages at the gate terminals of the transistor 78 and 80 are to be sufficiently high so as to maintain these transistors in a state of conduction during the reset process. Waveform QE is always high except when used as a chopper of the integrated waveform of the signal outputted by the detector 12. The chopping action is beneficial because it reduces noise associated with low frequency signal components (l/f noise). The voltage VB outputted by the first stage 58 is sufficiently high to insure conduction of the two transistors 78 and 80 during the reset process, thereby allowing the capacitor 84 and 86 to be restored to their initial values of charge in response to he voltages Q2 and QD supplied by the pulsing unit 28 to the transistor 76. The resetting of the second stage 60 operates in a manner corresponding to that of the resetting of the first stage 58.

The transistor 82 of the multiplexer stage 46 serves as a buffer amplifier stage to separate line capacitance of the multiplexer 26 and succeeding circuitry from the amplifying channels, this being particularly advantageous in view of the low power operation of the amplifiers 14. The transistor 82 also serves in the multiplexing operation by coupling the signal at node 88 to the summing amplifier 48 (FIG. 1) upon energization of the transistor 82 with current Is from the pulsing unit 28. In the absence of the current Is, the transistor 82 acts as an open circuit, The pulse of current Is may be provided at a convenient time for sampling the detector signal, the sampling of the signals of the various detectors of each of the amplifying channels (FIG. 1) being accomplished in a staggered fashion. Thereby, the detector signals are applied sequentially to the image processor 24 for formation of the image of the scene 22.

As has been described above, with reference to FIG. 2, the amplifiers 14 are activated sequentially. Each set 32 of the pulses 34 corresponds to the pulse signal waveforms presented in FIG. 5. Thus, the operation described above for one of the amplifiers 14 is repeated for each of the other amplifiers 14 in a repeating sequence synchronized with the scanning of the mirror 50. This results in a set of detector signals suitable for processing by the processor 24 to form an image of the scene 22.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims. In particular, it is noted that in the design of FET circuits employing complementary MOS (metal-oxide semiconductor) structure, source and drain connections of a transistor can be interchanged upon the substitution of an N-channel transistor for a P-channel transistor. Therefore, in the following claims, it is to be understood that a recital of source and drain connections is fully equivalent to the interposition of drain and source terminals upon substitution of the alternate form of FET.

What is claimed is:

1. An amplifier comprising:
    a first transistor and a second transistor, a source terminal of one of said transistors being connected to a drain terminal of the other of said transistors at a junction;
    an energy storage element connected to said junction;
    charge means connected to a gate terminal of said first transistor for activating said first transistor to charge said storage element with electric energy during a first interval, said charge means acting periodically to provide a succession of said first intervals;
    signal means connected to a gate terminal of said second transistor for applying a signal sample to said second transistor during a second interval subsequent to said first interval, said first and said second transistors acting to amplify said signal by imparting energy thereto extracted from said storage element, said signal means acting periodically to provide a succession of signal samples during a succession of said second intervals; and
    disconnect means connected to a drain terminal of said first transistor and being operative periodically to disconnect said first and said second transistors from any external source of power during said second interval, said charge means inhibiting a flow of power from any external source of power during a succession of third intervals wherein each of said third intervals extends from the end of a second interval to the next occurrence of a first interval.

2. An amplifier according to claim 1 wherein said signal means includes means for integrating the signal, said integrating means including capacitor means coupled between said gate terminal of said second transistor and a source terminal of said second transistor.

3. An amplifier according to claim 1 further comprising a second energy storage element connected to a source terminal of said second transistor, the drain terminal of said second transistor connecting with the source terminal of said first transistor to provide a series circuit of said second transistor between said second storage element and said first transistor.

4. An amplifier according to claim 3 wherein each of said storage elements comprises a capacitor, and wherein said first and said second transistors act to amplify said signal by imparting energy thereto extracted from both of said storage elements.

5. An amplifier according to claim 4 wherein said signal means includes means for integrating the signal, said integrating means including capacitor means coupled between said gate terminal of said second transistor and said source terminal of said second transistor.

6. An amplifier according to claim 5 wherein said signal means further comprises means for detecting the signal and means for resetting said detecting means prior to each of said signal samples, said capacitor means of said integrating means being coupled to said detecting means, and wherein said resetting means discharges said capacitor means.

7. An amplifier according to claim 4 wherein said signal means comprises: resetting means periodically operative at a beginning of each said first intervals; and means including a capacitor for integrating the signal, said resetting means discharging said capacitor; and wherein
    said first transistor and said second transistor constitute a first stage of said amplifier, said amplifier further comprising a second stage including:
    a first and a second and a third transistor serially connected together;
    a first energy storage capacitor connected to a junction of said first and said second transistors;
    a second energy storage capacitor connected to a source terminal of said third transistor, a drain terminal of said third transistor being connected to a source terminal of said second transistor at a junction of said second and said third transistors, an output terminal of said first stage being connected to an input terminal of said second stage wherein said input terminal of said second stage is a gate terminal of said second transistor;
    second charge means connected to a gate terminal of said first transistor of said second stage for periodically activating said first transistor to charge said first and said second storage capacitors with electric energy during a fourth interval commencing at the end of a second interval, there being a succession of said fourth intervals following successive ones of said second intervals; and
    second disconnect means connected to a drain terminal of said first transistor of said second stage and being operative periodically to disconnect said first and said second and said third transistors of said second stage from any external source of power during a later portion of said fourth interval, said second charge means inhibiting a flow of power from any external source of power at time intervals between successive occurrences of said fourth intervals.

8. An amplifier according to claim 7 wherein said transistors of said second stage are operative to transfer charge between said first and second storage capacitors of said second stage in response to a transmittal of a signal from the output terminal of said first stage to the input terminal of said second stage, there being an output terminal of said second stage at said junction between said first and said second transistors of said second stage.

9. An amplifier according to claim 8 further comprising means synchronized with the times of occurrence of said fourth intervals for extracting a signal sample from said output terminal of said second stage.

10. An amplifier according to claim 7 further comprising gating means connected to a gate terminal of said third transistor of said second stage for gating a signal coupled from said output terminal of said first stage to said input terminal of said second stage.

11. An imaging system responsive to incident radiation of a scene for forming an image of the scene, the system comprising:

an array of detectors;

an optical unit for focusing incident radiation of a scene upon said detectors, said array of detectors being positioned at a focal plane of said optical unit for detecting said radiation, said detectors producing signals in response to the incident radiation;

a set of amplifiers, individual ones of the amplifiers being coupled to respective ones of the detectors for amplifying signals of the detectors;

timing means for staggering the operations of individual ones of said amplifiers;

muliplexing means for combining output signals of the amplifiers; and processor means coupled to said set of amplifiers via said muliplexing means for forming an image of the scene from the amplifier output signals;

and wherein each of said amplifiers comprises:

a first transistor and a second transistor, a source terminal of one of said transistors being connected to a drain terminal of the other of said transistors at a junction;

an energy storage element connected to said junction;

charge means connected to a gate terminal of said first transistor for activating said first transistor to charge said storage element with electric energy during a first interval, said charge means acting periodically to provide a succession of said first intervals;

signal means interconnecting a respective one of said detectors to a gate terminal of said second transistor for applying a sample of a detector signal to said second transistor during a second interval subsequent to said first interval, said first and said second transistors acting to amplify said signal by imparting energy thereto extracted from said storage element, said signal means acting periodically to provide a succession of signal samples during a succession of said second intervals; and disconnect means connected to a drain terminal of said first transistor and being operative periodically to disconnect said first and said second transistors from any external source of power during said second interval, said charge means inhibiting a flow of power from any external source of power during a succession of third intervals wherein each of said third intervals extends from the end of a second interval to the next occurrence of a first interval.

12. A system according to claim 11 wherein, in each of said amplifiers, said signal means includes means for integrating the signal, said integrating means including capacitor means coupled between said gate terminal of said second transistor and a source terminal of said second transistor; said amplifier further comprising a second energy storage element connected to a source terminal of said second transistor, the drain terminal of said second transistor connecting with the source terminal of said first transistor to provide a series circuit of said second transistor between said second storage element and said first transistor; and wherein each of said storage elements comprises a capacitor, said first and said second transistors acting to amplify said signal by imparting energy thereto extracted from both of said storage elements.

13. A system according to claim 11 wherein said first transistor and said second transistor constitute a first stage of said amplifier, said amplifier further comprising a second stage including:

a first and a second and a third transistor serially connected together;

a first energy storage capacitor connected to a junction of said first and said second transistors;

a second energy storage capacitor connected to a source terminal of said third transistor, a drain terminal of said third transistor being connected to a source terminal of said second transistor at a junction of said second and said third transistors, an output terminal of said first stage being connected to an input terminal of said second stage wherein said input terminal of said second stage is a gate terminal of said second transistor;

second charge means connected to a gate terminal of said first transistor of said second stage for periodically activating said first transistor to charge said first and said second storage capacitors with electric energy during a fourth interval commencing at the end of a second interval, there being a succession of said fourth intervals following successive ones of said second intervals; and second disconnect means connected to a drain terminal of said first transistor of said second stage and being operative periodically to disconnect said first and said second and said third transistors of said second stage from any external source of power during a later portion of said fourth interval, said second charge means inhibiting a flow of power from any external source of power at time intervals between successive occurrences of said fourth intervals.

14. A system according to claim 13 further comprising gating means connected to a gate terminal of said third transistor of said second stage for gating a signal coupled from said output terminal of said first stage to said input terminal of said second stage.

* * * * *